(12) United States Patent
Mizrahi et al.

(10) Patent No.: US 10,571,637 B2
(45) Date of Patent: Feb. 25, 2020

(54) THERMALLY INTERFACING CHIP ON GLASS ASSEMBLY

(71) Applicant: FINISAR CORPORATION, Sunnyvale, CA (US)

(72) Inventors: Idan Mizrahi, Fremont, CA (US); Stephen John Macica, Truckee, CA (US)

(73) Assignee: Finisar Corporation, Sunnyvale, CA (US)

( * ) Notice: Subject to any disclaimer, the term of this patent is extended or adjusted under 35 U.S.C. 154(b) by 318 days.

(21) Appl. No.: 15/583,409

(22) Filed: May 1, 2017

(65) Prior Publication Data

US 2017/0315314 A1 Nov. 2, 2017

Related U.S. Application Data

(60) Provisional application No. 62/329,840, filed on Apr. 29, 2016.

(51) Int. Cl.
G02B 6/42 (2006.01)
H04B 10/40 (2013.01)
H04B 10/80 (2013.01)

(52) U.S. Cl.
CPC .......... G02B 6/4267 (2013.01); G02B 6/425 (2013.01); G02B 6/4238 (2013.01);
(Continued)

(58) Field of Classification Search
CPC .. G02B 6/4267; G02B 6/4266; G02B 6/4269; G02B 6/4268; G02B 6/4272;
(Continued)

(56) References Cited

U.S. PATENT DOCUMENTS 6,353,491 B1 3/2002 Tanaka
6,588,949 B1 7/2003 Zhou
(Continued)

FOREIGN PATENT DOCUMENTS

WO 20160061129 A1 4/2016

OTHER PUBLICATIONS

International Search Report and Written Opinion dated Aug. 28, 2017 in related PCT Application No. PCT/US2017/030443 (12 pages).

Primary Examiner — John R Lee
(74) Attorney, Agent, or Firm — Maschoff Brennan

(57) ABSTRACT

In one example embodiment, an optoelectronic assembly includes an electronic substrate, a transparent component coupled on a first side of the electronic substrate, and a first component coupled to a second side of the electronic substrate opposite the first side. The electronic substrate, the transparent component, and the first component may define a hermetically sealed enclosure. A laser array or a receiver array may be mechanically coupled to the transparent component inside of the enclosure and oriented to transmit or receive optical signals through the transparent component. The laser array or the receiver array may be electrically coupled to the electronic substrate. A second component may be positioned between the first component and the transparent component in the hermetically sealed enclosure with a thermal interface material forming a first interface between the second component and the transparent component.

20 Claims, 9 Drawing Sheets

(52) U.S. Cl.
CPC ......... *G02B 6/4239* (2013.01); *G02B 6/4245* (2013.01); *G02B 6/4246* (2013.01); *G02B 6/4251* (2013.01); *H04B 10/40* (2013.01); *H04B 10/801* (2013.01)

(58) Field of Classification Search
CPC .. G02B 6/4251; G02B 6/4246; G02B 6/4245; G02B 6/4239; G02B 6/4238; G02B 6/425; G02B 6/00; H01S 5/0261; H01S 5/026; H01S 5/4025; H04B 10/40; H04B 10/801
See application file for complete search history.

(56) References Cited

U.S. PATENT DOCUMENTS

| | | | |
|---|---|---|---|
| 7,239,767 B2 | 7/2007 | Kim | |
| 7,539,366 B1 | 5/2009 | Baks | |
| 9,869,833 B2* | 1/2018 | Wang | ................ H04B 10/2504 |
| 10,012,792 B2* | 7/2018 | Carpentier | ........... G02B 6/4257 |
| 2002/0066523 A1* | 6/2002 | Sundstrom | ............. H01L 24/12 |
| | | | 156/229 |
| 2003/0201462 A1 | 10/2003 | Pommer | |
| 2004/0086011 A1 | 5/2004 | Bhandarkar | |
| 2004/0264884 A1 | 12/2004 | Liu | |
| 2005/0063642 A1 | 3/2005 | Gallup | |
| 2005/0254758 A1* | 11/2005 | Kropp | ................ G02B 6/4201 |
| | | | 385/89 |
| 2006/0210234 A1 | 9/2006 | Shiv | |
| 2006/0245697 A1 | 11/2006 | Toillon | |
| 2007/0063202 A1* | 3/2007 | Leib | ................ H01L 27/14618 |
| | | | 257/80 |
| 2007/0190747 A1* | 8/2007 | Humpston | .......... B81C 1/00285 |
| | | | 438/460 |
| 2009/0226130 A1* | 9/2009 | Doany | ................ G02B 6/4201 |
| | | | 385/14 |
| 2010/0326714 A1 | 12/2010 | Fukuzono | |
| 2011/0008053 A1 | 1/2011 | Nguyen | |
| 2011/0044369 A1 | 2/2011 | Andry et al. | |
| 2011/0044696 A1 | 2/2011 | Lim | |
| 2011/0101394 A1* | 5/2011 | McKenzie | .......... C23C 18/1657 |
| | | | 257/98 |
| 2012/0001166 A1* | 1/2012 | Doany | ................ G02B 6/4246 |
| | | | 257/43 |
| 2012/0014639 A1* | 1/2012 | Doany | ............... G02B 6/02042 |
| | | | 385/14 |
| 2012/0057816 A1 | 3/2012 | Krasulick | |
| 2012/0120976 A1* | 5/2012 | Budd | .................. G02B 6/4201 |
| | | | 372/34 |
| 2012/0178610 A1 | 7/2012 | Hublikar | |
| 2014/0110807 A1* | 4/2014 | Uekawa | ......... H01L 27/14618 |
| | | | 257/432 |
| 2014/0334773 A1* | 11/2014 | Mathai | ................ G02B 6/4292 |
| | | | 385/14 |
| 2015/0071643 A1 | 3/2015 | Shi et al. | |
| 2015/0282303 A1* | 10/2015 | Hsieh | ................... G02B 6/4272 |
| | | | 359/811 |
| 2015/0331206 A1* | 11/2015 | Dutta | ................ G02B 6/12002 |
| | | | 385/14 |
| 2016/0085038 A1* | 3/2016 | Decker | ................ G02B 6/4204 |
| | | | 385/14 |
| 2017/0315314 A1* | 11/2017 | Mizrahi | ................ G02B 6/4267 |

* cited by examiner

THERMALLY INTERFACING CHIP ON GLASS ASSEMBLY

CROSS-REFERENCE TO RELATED APPLICATIONS

This application claims the benefit of U.S. Provisional Patent Application No. 62/329,840, filed Apr. 29, 2016, titled THERMALLY INTERFACING CHIP ON GLASS ASSEMBLY, which is incorporated herein by reference in its entirety.

FIELD

The present disclosure generally relates to optoelectronic assemblies for signal transmission.

BACKGROUND

Light signals may be used to rapidly and reliably transmit information in a variety of applications such as fiber optic networks or computer systems.

Fiber optic networks have various advantages over other types of networks such as copper wire based networks. Many existing copper wire networks operate at near maximum possible data transmission rates and at near maximum possible distances for copper wire technology. Fiber optic networks may be used to reliably transmit data at higher rates over further distances than is possible with copper wire networks.

Computer systems employing high speed optical interconnects may provide improved performance when compared to other computers systems. The performance of some computer systems can be restricted by the rate that computer processors can access memory or communicate with other components in the computer system. The restriction can be due, in part, to the physical limitations of data interconnects such as electrical connections. For example, electrical pins with a particular size and/or surface area that may be used in electrical connections may only be capable of transmitting a specific amount of data, and in turn this may limit the maximum bandwidth for data signals. In some circumstances, such connections may result in bottlenecks when the maximum bandwidth of connections becomes a performance limiting factor.

Light signals (which may also be referred to as "optical signals") may be used to rapidly and reliably transmit information in a variety of applications such as fiber optic networks or computer systems. High speed optical interconnects using light signals may permit transmission of information at increased data rates to decrease or eliminate bottlenecks. Although light signals may be used to transmit data at increased data rates in fiber optic networks, computer systems or other applications, many electronic components use electrical signals. Optoelectronic assemblies may be used to convert electrical signals to optical signals, convert optical signals to electrical signals, or convert both electrical signals to optical signals and optical signals to electrical signals. The optoelectronic assemblies may be used in fiber optic networks, computer systems or other environments.

Some optoelectronic assemblies may employ a semiconductor mounting technique called "flip chip." The term "flip chip" may refer to specific methods of forming semiconductor devices, and/or to specific structures of semiconductor devices. Specifically, flip chip devices may use controlled collapse chip connections to interconnect semiconductor devices to other circuitry.

In a typical flip chip process, integrated circuits may be created on a wafer. Pads may be metalized on the surface of the chips. Solder dots may be deposited on each of the pads. The wafer may be cut into chips. The chips may be flipped and positioned so that the solder balls are facing the connectors on external circuitry. The solder balls may be melted to electrically couple the chip to external circuitry. The mounted chip may be underfilled using an electrically insulating adhesive.

Although flip chip processes are relatively common for certain semiconductor devices, there are challenges in implementing flip chip processes in optoelectronic assemblies. For example, optoelectronic assemblies may include various requirements relating to dimension specifications, manufacturing tolerances, heat dissipation, stress tolerance, electrical coupling, power handling, and/or others. Such aspects may provide limitations on the structure or method of forming flip chip optoelectronic assemblies. Among other aspects, the present disclosure provides solutions to overcome challenges related to flip chip optoelectronic assemblies and their manufacture.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

An example optoelectronic assembly may include a transparent component that extends between a first surface and an oppositely positioned second surface. A laser array may be coupled to the second surface of the transparent component. The laser array may be oriented to transmit optical signals through the transparent component. A receiver array may be coupled to the second surface of the transparent component. The receiver array may be oriented to receive optical signals through the transparent component. An electronic substrate may be mechanically coupled to the transparent component. A first component may be coupled to the electronic substrate opposite the transparent component. The first component may define a receptacle. A second component may be positioned between the first component and the transparent component in the receptacle defined by the first component. A first surface of the second component may be coupled to the laser array and the receiver array by a thermal interface material. The thermal interface material may be softer than the first component and the second component. A second surface of the second component may be coupled to the first component by solder. The second surface may be positioned opposite the first surface.

Another example optoelectronic assembly may include an electronic substrate, a transparent component coupled on a first side of the electronic substrate, and a first component coupled to a second side of the electronic substrate opposite the first side. The electronic substrate, the transparent component, and the first component may define a hermetically sealed enclosure. A laser array or a receiver array may be mechanically coupled to the transparent component inside of the enclosure and oriented to transmit or receive optical signals through the transparent component. The laser array or the receiver array electrically may be coupled to the electronic substrate. A second component may be positioned between the first component and the transparent component in the hermetically sealed enclosure with a thermal interface material forming a first interface between the second component and the transparent component.

In another example, an optoelectronic assembly may include a heat sink including a first component positioned inside of a receptacle of a second component. The optoelectronic assembly may include a transparent component and an optoelectronic array coupled to the transparent component and oriented to transmit or receive optical signals through the transparent component. An electronic component may be coupled to the transparent component and an electronic substrate may be positioned in between the transparent component and the a second component. A thermal interface material may be positioned between the optoelectronic array, the electronic component, and the first component. The thermal interface material may couple the first component to the optoelectronic array and the electronic component.

This Summary introduces a selection of concepts in a simplified form that are further described below in the Detailed Description. This Summary is not intended to identify key features or essential characteristics of the claimed subject matter, nor is it intended to be used as an aid in determining the scope of the claimed subject matter.

BRIEF DESCRIPTION OF THE DRAWINGS

Example embodiments will be described and explained with additional specificity and detail through the use of the accompanying drawings in which.

DETAILED DESCRIPTION

Reference will be made to the drawings and specific language will be used to describe various aspects of the disclosure. Using the drawings and description in this manner should not be construed as limiting its scope. Additional aspects may be apparent in light of the disclosure, including the claims, or may be learned by practice.

The present disclosure generally relates to optoelectronic assemblies for signal transmission. As used herein, the term "optoelectronic assemblies" includes assemblies having optical and electrical components. Examples of optoelectronic assemblies include transponders, transceivers, transmitters, and/or receivers, any combination thereof, or any portion thereof.

Figure 1:
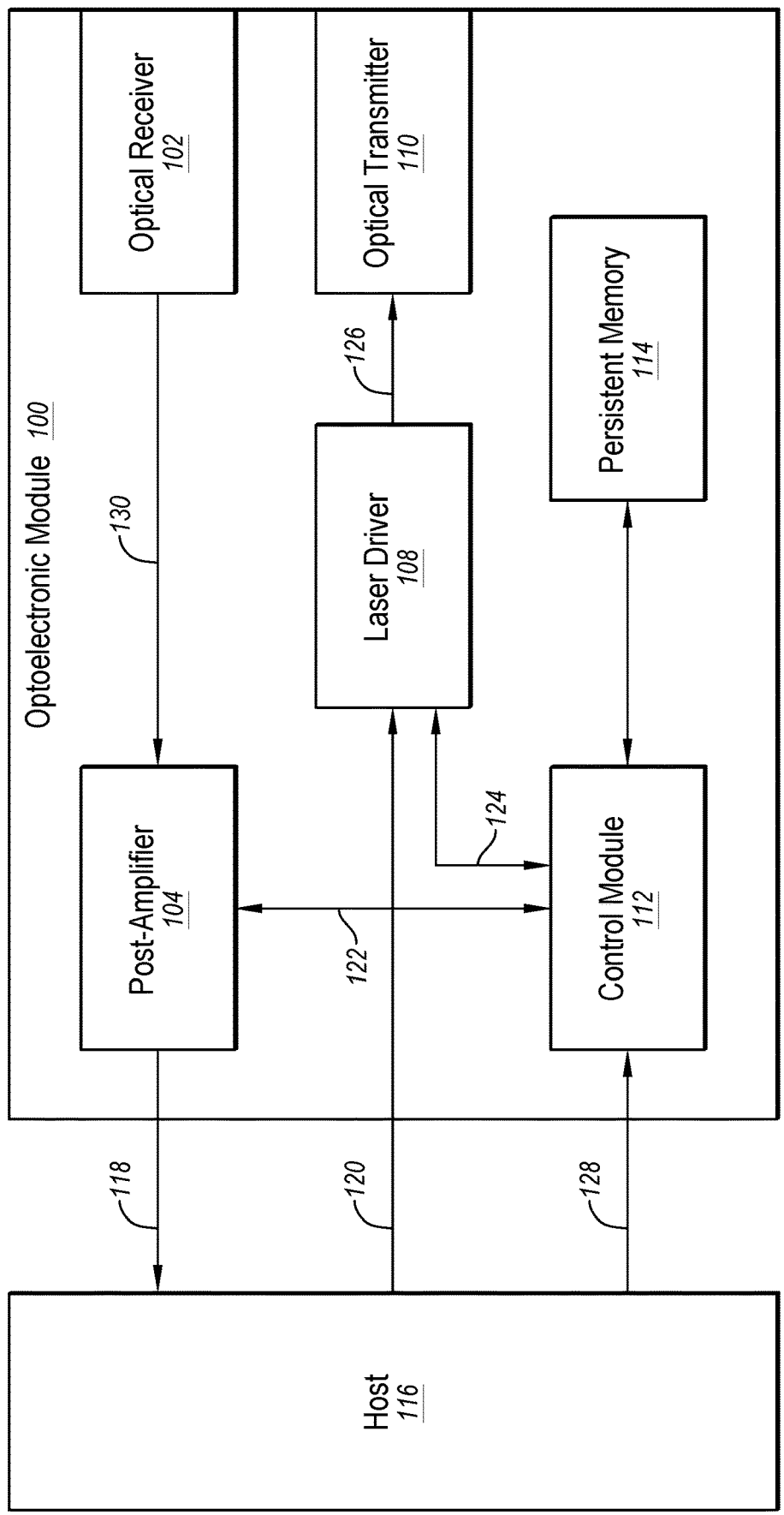
FIG. 1 is a schematic view of an example optoelectronic module.

FIG. 1 is a schematic view of an example optoelectronic module 100. The optoelectronic module 100 may be implemented as part of a fiber optic network. The optoelectronic module 100 may be used to convert electrical signals to optical signals which then travel through fiber optic cables of the fiber optic network. Alternatively or additionally, the optoelectronic module 100 may convert optical signals to electrical signals. The optoelectronic module 100 may be configured to receive either one or multiple electrical signals and/or optical signals. The optoelectronic module 100 may also be configured to output either one or multiple electrical signals and/or optical signals.

The optoelectronic module 100 will be described only for example, and such description is not restrictive of the scope of this disclosure. As illustrated, the optoelectronic module 100 includes an optical receiver 102, a post-amplifier 104, a laser driver 108, an optical transmitter 110, a control module 112, and a persistent memory 114.

In operation, the optoelectronic module 100 receives an optical signal at the optical receiver 102. The optical receiver 102 transforms the optical signal into an electrical signal. The optical receiver 102 provides the resulting electrical signal 130 to the post-amplifier 104. The post-amplifier 104 amplifies the electrical signal 130 and provides the amplified signal 118 to a host 116. The host 116 may include any computing system capable of communicating with the optoelectronic module 100, such as a media access controller ("MAC") card, a Synchronous Optical Networking (SONET) framer, or the like. The optoelectronic module 100 may also receive electrical signals from the host 116 for transmission as optical signals. Specifically, the laser driver 108 may receive an electrical signal 120 from the host 116, and may drive the optical transmitter 110 to emit an optical signal. The optical transmitter 110 includes a suitable light source, such as a semiconductor laser, that is driven by a drive signal 126 that is representative of the electrical signal 120 provided by the host 116, thereby causing the light source to emit optical signals representative of the information carried in the electrical signal 120.

The behavior of the optical receiver 102, the post-amplifier 104, the laser driver 108, and the optical transmitter 110 may vary dynamically due to a number of factors. For example, temperature changes, power fluctuations, and feedback conditions may each affect the performance of these components. Accordingly, the optoelectronic module 100 may include the control module 112 which may evaluate conditions, and may adjust the operation of the optoelectronic module 100 in response to the evaluated conditions. The evaluated conditions may include environmental conditions such as temperature, and/or operating conditions such as emitted optical power and/or wavelength. The evaluated environment conditions and/or operating conditions allow the control module 112 to optimize the dynamically varying performance of the optoelectronic module 100.

The control module 112 may be operably coupled to the post-amplifier 104 as represented by arrow 122 and operably coupled to the laser driver 108 as represented by arrow 124. The control module 112 may receive information such as operating conditions from the post-amplifier 104 and/or the laser driver 108. The control module 112 may transmit control signals to the post-amplifier 104 and/or the laser driver 108. The control module 112 may optimize the operation of the optoelectronic module 100 by adjusting settings on the post-amplifier 104 and/or the laser driver 108 with the control signals.

The control module 112 may have access to the persistent memory 114, which in some embodiments includes an Electrically Erasable and Programmable Read Only Memory ("EEPROM"). Persistent memory 114 may alternately or additionally be any other non-volatile memory source. Any group of components mentioned in optoelectronic module 100 may be packaged together in the same package or in different packages without restriction.

The control module 112 may include a host interface 128 for communicating clock and/or data signals from the host 116 to the control module 112 and/or for communicating data from the control module 112 to the host 116. The host interface 128 may implement any one of a variety of communication protocols, including, but not limited to, Inter-Integrated Circuit (I2C), Management Data Input/Output (MDIO), Serial Peripheral Interface (SPI), or the like or any combination thereof.

In optoelectronic assemblies including flip chip configurations, some of the interfaces, bonds, or couplings between various components may be relatively stiff and/or brittle. In some optoelectronic assemblies, many components may be positioned relatively close to one another, leading to small tolerances for various aspects of the optoelectronic assemblies, including positioning of various components.

Some aspects described in this disclosure may be implemented in flip chip optoelectronic assemblies. Such aspects may address challenges associated with implementing flip chip processes in optoelectronic assemblies. For example, aspects may relate to manufacturing of flip chip optoelectronic assemblies to comply with various requirements relating to dimension specifications, manufacturing tolerances, heat dissipation, stress tolerance, electrical coupling, power handling, and/or others.

Some components of optoelectronic assemblies may create heat during operation, and some may require a relatively high rate of heat dissipation. Specifically, components such as lasers, receivers, drivers, and/or electrical components may create heat during operation that may need to be dissipated for the optoelectronic assemblies to operate properly. Some of the components may be assigned a certain range of operating temperatures that may not be exceeded for the components to perform properly and/or prevent damage to sensitive portions of the optoelectronic assemblies. Accordingly, heat management of optoelectronic assemblies may be useful for the optoelectronic assemblies to operate properly in various conditions. For example, heat management may be useful for high-density optoelectronic assemblies that include many components that are positioned relatively close to one another, creating relatively more heat within a space.

Heat created during operation may also result in stresses in optoelectronic assemblies. For example, when an optoelectronic assembly is heated and/or cooled, various portions of the optoelectronic assembly may expand or contract based on various thermal expansion characteristics. Portions of the optoelectronic assembly with different coefficients of thermal expansion may expand or contract different amounts and/or at different rates. This may cause stress or variations in tolerances in various portions of the optoelectronic assembly.

In some circumstances, stress effects from heating may be manifested in the various interfaces, bonds, and/or couplings. Particularly if the interfaces, bonds, and/or couplings are positioned between two materials with different coefficients of thermal expansion. Such stress effects may weaken or break the interfaces, bonds, or couplings, rendering the optoelectronic assembly inoperable. Soft or pliant materials may be used to mitigate such stress effects. However, soft or pliant materials may not be suitable for some portions of optoelectronic assemblies. For example, some soft or pliant materials may have poorer thermal conductivity, and may not be suitable to dissipate heat in portions of optoelectronic assemblies. In another example, soft or pliant materials may have different coefficients of thermal expansion than other portions of optoelectronic assemblies, and this difference may actually increase thermal stress effects. Furthermore, some portions of optoelectronic assemblies may support or reinforce portions of the optoelectronic assemblies. In such circumstances, harder materials may be implemented.

Optoelectronic assemblies may include features such as heat sinks and/or thermoelectric coolers to manage the heat created during operation. For heat sinks, materials with relatively high thermal conductivity may be desirable. However, materials with high thermal conductivity may generally be harder and/or more brittle than relatively softer materials that may otherwise be employed to reduce stress effects.

In some circumstances, higher density filler materials may be included in softer or pliant materials to increase their thermal conductivity. But as higher density filler is introduced to increase thermal conductivity, the softness, viscosity and/or compliance of the resulting substance may decrease.

Aspects described in this disclosure may facilitate addressing stress effects while maintaining suitable thermal dissipation in optoelectronic assemblies. Aspects of the optoelectronic assemblies described may include various beneficial thermal properties to maintain the integrity of their components, increase operating lifespan, expand the range of operating conditions, and/or create new potential applications for the described optoelectronic assemblies. Furthermore, beneficial thermal properties may be useful for high-density applications of optoelectronic assemblies in which many components are provided in close proximity of one another.

Figure 2:
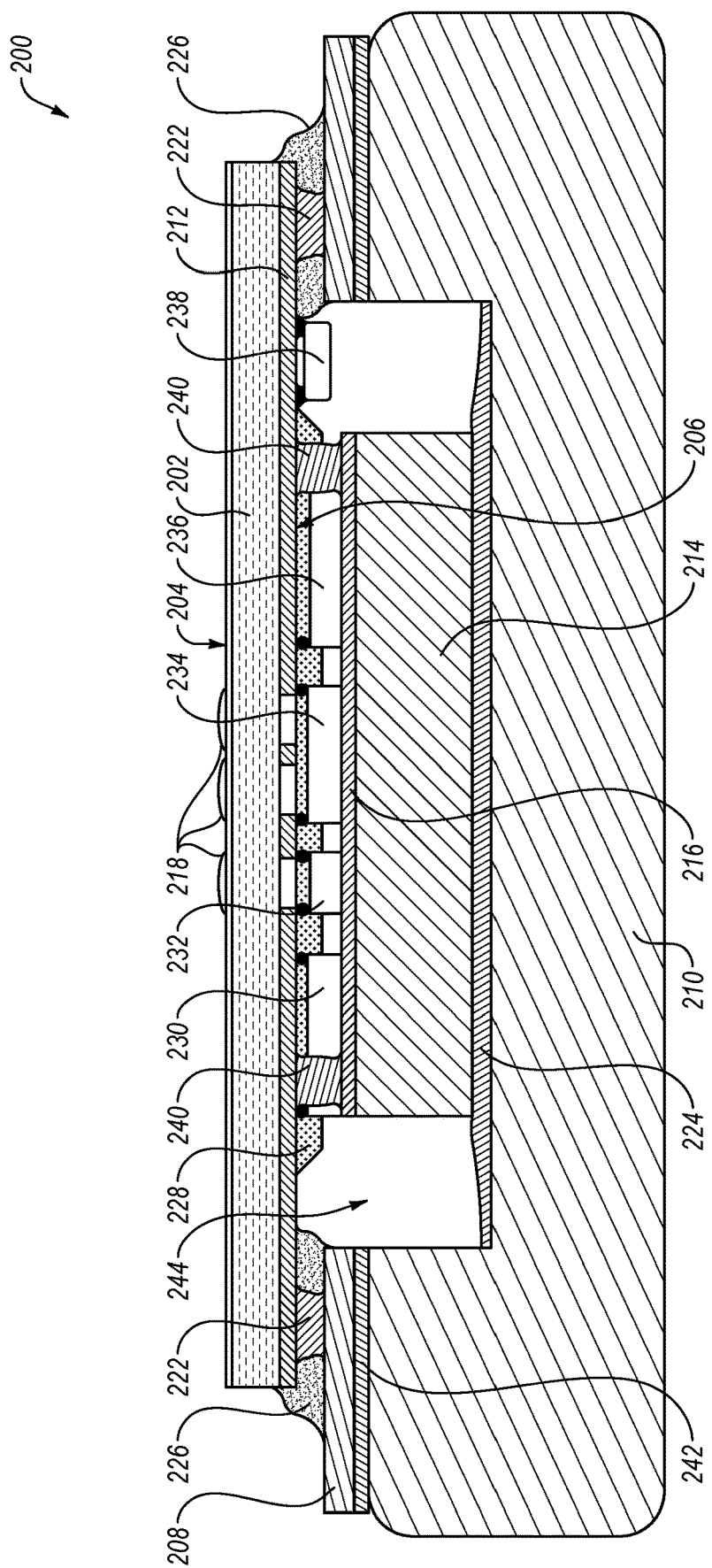
FIG. 2 is a schematic side view of an example optoelectronic assembly that may be implemented in the optoelectronic module of FIG. 1.

FIG. 2 illustrates an example optoelectronic assembly 200 that may be implemented in the optoelectronic module 100 of FIG. 1 and/or in other operating environments. The optoelectronic assembly 200 may include a transparent component 202 that is formed of an at least partially transparent or translucent material such as glass, plastic, polymer, or the like. The transparent component 202 may extend between a first surface 204 and an oppositely-positioned second surface 206. One or more lenses 218 may be positioned on the first surface 204 and various components of the optoelectronic assembly 200 may be positioned on the second surface 206. As illustrated, the components positioned on the second surface 206 may include a laser array 232, a receiver array 234, a driver 236, an electrical component 230 and/or a passive component 238, or any combination thereof. The laser array 232 and the receiver array 234 may be referred to as optoelectronic arrays.

The laser array 232 may be oriented to emit optical signals through the transparent component 202 and one or more of the lenses 218. The receiver array 234 may be oriented to receive optical signals through the transparent component 202 and/or one or more of the lenses 218. The lenses 218 may be configured to convey, direct and/or focus optical signals from the laser array 232 and/or to the receiver array 234. The lenses 218 may be optically-transmissive surfaces such as curved surfaces (e.g. concave, or convex), planar surfaces, or a combination thereof.

The laser array 232 may include an array of light sources, such as semiconductor lasers, light emitting diodes, vertical cavity surface-emitting lasers (VCSELs), edge-emitting lasers, distributed feedback (DFB) lasers, distributed Bragg reflector (DBR) lasers, or any other suitable light sources. The driver 236 may be configured to receive electrical signals from a host, and to drive the laser array 232 to emit optical signals. In some aspects, the driver 236 may correspond to the laser driver 108 described with respect to FIG. 1. In some configurations, the driver 236 may be a silicon germanium integrated circuit driver. The light sources of the laser array 232 may be driven by a drive signal from the driver 236, thereby causing the light sources to emit optical signals representative of information. The receiver array 234 may include an array of receivers, such as photodiodes, photoresistors, reverse-biased light-emitting diodes (LEDs), photodetectors, or any other suitable components capable of detecting light. In some configurations, the receiver array 234 may include at least one monitor photodiode (MPD).

The electrical component 230 may be an integrated circuit (IC) or any electrical components suitable for use in the optoelectronic assembly 200. In some configurations, the electrical component 230 may correspond to the control module 112 described with respect to FIG. 1. The optoelectronic assembly 200 may include any number of passive components such as the passive component 238. The passive components may include resistors, capacitors, thermistors, or any other components suitable for use in the optoelectronic assembly 200.

A redistribution layer 212 may be positioned on at least a portion of the second surface 206. The redistribution layer 212 may be an electrically conductive layer configured to electrically couple some or all of the components positioned on the second surface 206 such as the laser array 232, the receiver array 234, the driver 236, the electrical component 230 and/or the passive component 238, or any combination thereof. As illustrated, the laser array 232, the receiver array 234, the driver 236, the electrical component 230 and/or the passive component 238 may be electrically coupled to the redistribution layer 212 via electrical bonds positioned between each, respectively.

An underfill material 228 may be positioned between the laser array 232, the receiver array 234, the driver 236, the electrical component 230 and the transparent component 202. The underfill material 228 may be a transparent or translucent material that permits optical signals to travel through the transparent component 202 to the receiver array 234 or from the laser array 232. The underfill material 228 may fill a space between the laser array 232, the receiver array 234 and the transparent component 202. In some configurations, the material of the underfill material 228 may be selected to substantially match the refractive index of the transparent component 202. The underfill material 228 may be positioned to at least partially surround the laser array 232, the receiver array 234, the driver 236, and/or the electrical component 230.

The transparent component 202 may be coupled to an electronic substrate 208 by first solder 222 and/or an underfill material 226. The electronic substrate 208 may be a printed circuit board (PCB), a flex circuit, or any other suitable electronic substrate. In some configurations, the first solder 222 and the underfill material 226 cooperate to couple the transparent component 202 to the electronic substrate 208. The first solder 222 may electrically couple the transparent component 202 to the electronic substrate 208. Specifically, the first solder 222 may electrically couple the redistribution layer 212 of the transparent component 202 to electrical couplings of the electronic substrate 208. In some configurations, the first solder 222 may be electrically coupled to pads on the electronic substrate 208. The underfill material 226 may seal the transparent component 202 to the electronic substrate 208. In some configurations, the underfill material 226 may form a hermetic or semi-hermetic seal between the transparent component 202 and the electronic substrate 208. In some configurations, the underfill material 226 may reinforce or support the electrical connections formed by the first solder 222.

The electronic substrate 208 may be coupled to a first component 210. The first component 210 may be a heat sink, a stiffener, or both. The first component 210 may be formed of a material with a relatively high thermal conductivity. Additionally or alternatively, the first component 210 may be formed of a relatively stiff material. For example, the first component 210 may be formed of or may include nickel plated copper. The first component 210 may support or reinforce portions of the electronic substrate 208 and/or the transparent component 202. In some configurations, the first component 210 may act to decrease bending or flexing of the electronic substrate 208 and/or the transparent component 202. The first component 210 may conduct heat away from portions of the optoelectronic assembly 200, for example, during operation of the optoelectronic assembly 200. As illustrated, a first side of the electronic substrate 208 may be coupled to the transparent component 202 and an oppositely positioned second side of the electronic substrate 208 may be coupled to the first component 210. In some configurations, the electronic substrate 208 may be coupled to the first component 210 by an adhesive 242. In such configurations, the adhesive 242 may be positioned at the interface between the electronic substrate 208 and the first component 210.

The transparent component 202 may be coupled to a second component 214. The second component 214 may be positioned at least partially within a receptacle 244 defined by the first component 210. In some configurations, the transparent component 202 may be coupled to the second component 214 by an adhesive 240. The adhesive 240, the laser array 232, the receiver array 234, the driver 236, the electrical component 230 and/or the passive component 238 may be positioned between the second component 214 and the transparent component 202. The adhesive 240 may fill a portion of the space between the second component 214 and the transparent component 202.

As illustrated, a first surface of the second component 214 may be coupled to the laser array 232, the receiver array 234, the driver 236, and/or the electrical component 230 and an oppositely positioned second surface of the second component 214 may be coupled to the first component 210. Specifically, the first surface of the second component 214 may be coupled to the laser array 232, the receiver array 234, the driver 236, and/or the electrical component 230 by a thermal interface material 216. The second surface of the second component 214 may be coupled to the first component 210 by second solder 224. The thermal interface material 216 may form the interface between the laser array 232, the receiver array 234, the driver 236, and/or the electrical component 230 and the second component 214. The second solder 224 may form the interface between the second component 214 and the first component 210.

The second component 214 may be formed of a material with a relatively high thermal conductivity. Additionally or alternatively, the second component 214 may be formed of a relatively stiff material. Additionally or alternatively, the thermal interface material 216 may be formed of a material with a relatively high thermal conductivity. Additionally or alternatively, the thermal interface material 216 may be formed of a relatively soft and/or pliant material. For example, the thermal interface material 216 may be formed of or may include silicone with a filler material. In some configurations, the thermal interface material 216 may be formed of a material softer than the second component 214 and/or the first component 210. In some configurations, the thermal interface material 216 may be a relatively thin layer. For example, the thermal interface material 216 may be include a dimension such as thickness between 50 and 100 microns, between 50 and 75 microns, between 25 and 75 microns, less than 100 microns, less than 200 microns, less than 300 microns, greater than 25 microns, greater than 50 microns, or any suitable combination thereof. In another example, the thickness of the extent of the thermal interface material 216 may be between 50 and 100 microns, between 50 and 75 microns, between 25 and 75 microns, less than 100 microns, less than 200 microns, less than 300 microns, greater than 25 microns, greater than 50 microns, or any suitable combination thereof.

The second component 214 and/or the thermal interface material 216 may support or reinforce the laser array 232, the receiver array 234, the driver 236, and/or the electrical component 230. In some configurations, the second component 214 and/or the thermal interface material 216 may support the laser array 232, the receiver array 234, the driver 236, and/or the electrical component 230 as other portions of the optoelectronic assembly 200 expand, contract, bend, or flex as a result of forces acting upon the optoelectronic assembly 200, such as thermal expansion or contraction. In some configurations, the second component 214 and/or the thermal interface material 216 may facilitate in providing electrostatic discharge (ESD) and/or electromagnetic interference (EMI) protection for portions of the optoelectronic assembly 200, such as the laser array 232, the receiver array 234, the driver 236, and/or the electrical component 230. In such configurations, the materials of the second component 214 and/or the thermal interface material 216 may be selected to be suitable for providing ESD and/or EMI protection.

The second component 214, the thermal interface material 216, the second solder 224, and/or the first component 210 may conduct heat away from portions of the optoelectronic assembly 200. In some configurations, all of the second component 214, the thermal interface material 216, the second solder 224, and the first component 210 may contribute in permitting heat from dissipating from the laser array 232, the receiver array 234, the driver 236, and/or the electrical component 230, for example, during operation of the optoelectronic assembly 200.

As illustrated, the first component 210 and the transparent component 202 may seal the laser array 232, the receiver array 234, the driver 236, the electrical component 230 and/or the passive component 238 in a hermetic or semi-hermetic enclosure.

Aspects described in this disclosure may facilitate addressing stress effects while maintaining suitable thermal dissipation in optoelectronic assemblies. In some aspects, a heat sink of the optoelectronic assembly 200 may be formed of two separate components. For example, a heat sink of the optoelectronic assembly 200 may be formed of the first component 210 and the second component 214, and the separate components may be coupled to one another with a suitable coupling or interface, such as the second solder 224. Furthermore, the second component 214 may be coupled to the laser array 232, the receiver array 234, the driver 236, and/or the electrical component 230 by a relatively soft and/or pliant material such as the thermal interface material 216.

Such configurations may include suitable thermal dissipation for components such as the laser array 232, the receiver array 234, the driver 236, and/or the electrical component 230. Specifically, heat may be dissipated from the laser array 232, the receiver array 234, the driver 236, and/or the electrical component 230, through the thermal interface material 216, the first component 210, the second solder 224, and/or the second component 214. Additionally or alternatively, such configurations may facilitate decrease stress effects in the interfaces, bonds, or couplings the optoelectronic assembly 200. For example, the second component 214 and/or the thermal interface material 216 may support the laser array 232, the receiver array 234, the driver 236, and/or the electrical component 230 while decreasing stress effects in couplings such as the first solder 222, the adhesive 242, and/or the couplings between the transparent component 202 and the laser array 232, the receiver array 234, the driver 236, and/or the electrical component 230.

In some aspects, the thermal interface material 216 may provide mechanical and/or ESD protection for aspects of the optoelectronic assembly 200. Specifically, the thermal interface material 216 may facilitate in providing mechanical and/or ESD protection for the laser array 232, the receiver array 234, the driver 236, and/or the electrical component 230

FIGS. 3A-3F illustrate portions of the optoelectronic assembly 200 of FIG. 2. With reference to FIGS. 3A-3F, example aspects of manufacturing of optoelectronic assemblies, such as the optoelectronic assembly 200, will be described.

Figure 3A:
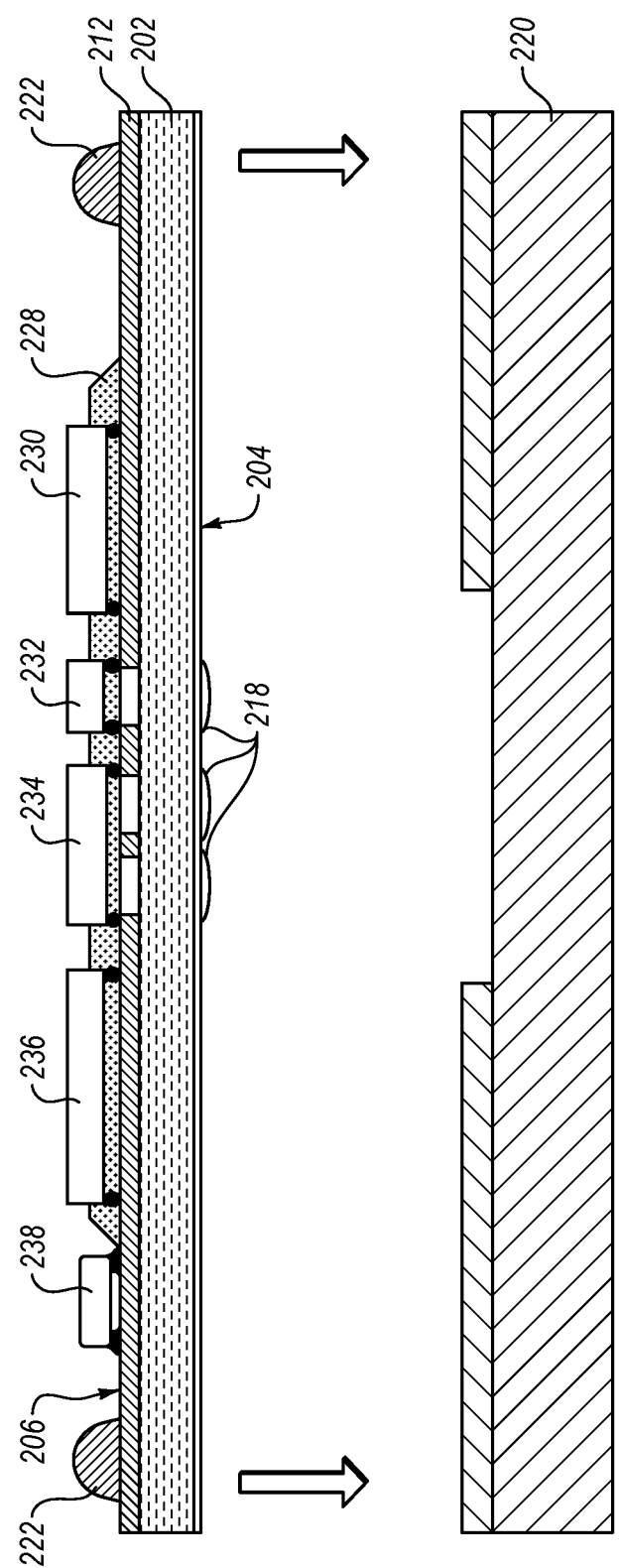
FIGS. 3A-3F are schematic side views of a portion of the optoelectronic assembly of FIG. 2.

As illustrated in FIG. 3A, the lenses 218 may be formed on the first surface 204 of the transparent component 202. The lenses 218 may be coupled to or formed on the first surface 204. Accordingly, the lenses 218 may be integral to the transparent component 202 or coupled to the transparent component 202 after it is formed. The redistribution layer 212 may be formed on the second surface 206 of the transparent component 202. The redistribution layer 212 may be deposited on the second surface 206. Depositing the redistribution layer 212 may include patterning and metallizing a conductive material onto the second surface 206, and/or any suitable process to form a conductive material on the second surface 206.

The laser array 232, the receiver array 234, the driver 236, the electrical component 230 and/or the passive component 238 may be coupled to or formed on the second surface 206 of the transparent component 202. In some configurations, such components may be coupled to the second surface 206, for example, by bond pads, solder, and/or other suitable structures. The bond pads may mechanically couple the laser array 232, the receiver array 234, the driver 236, the electrical component 230 and/or the passive component 238 to the second surface 206 and may electrically couple such components to the redistribution layer 212. In other configurations, the laser array 232, the receiver array 234, the driver 236, the electrical component 230 and/or the passive component 238 may be formed on the second surface 206 using any suitable process.

The first solder 222 may be coupled to the second surface 206. In some configurations, the first solder 222 may be electrically coupled to the redistribution layer 212. Either before or after the laser array 232, the receiver array 234, the driver 236, the electrical component 230 and/or the passive component 238 are coupled or formed on the second surface 206, the underfill material 228 may be coupled to or formed on the second surface 206, as illustrated.

Figure 3B:
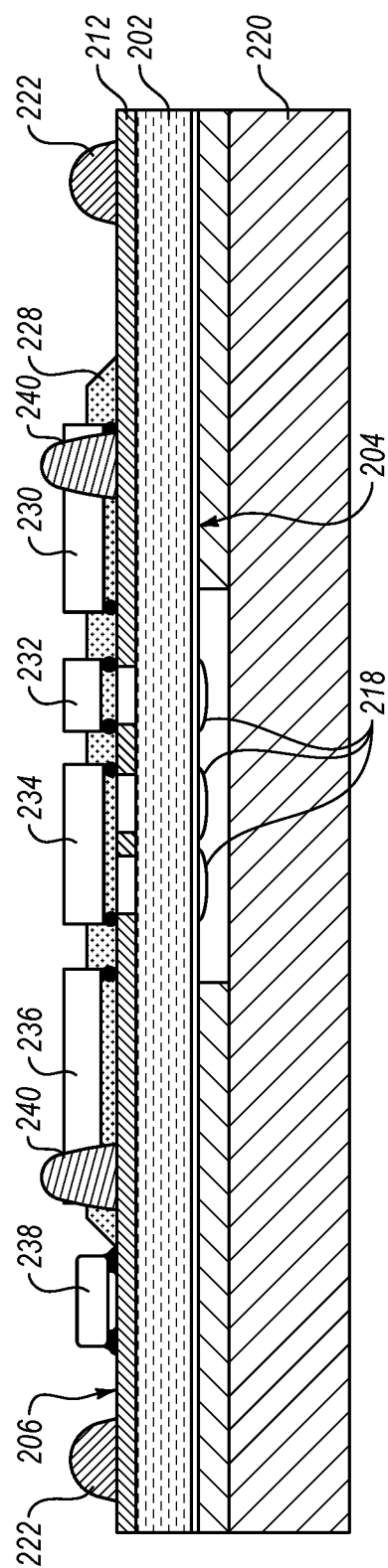

As illustrated in FIG. 3A, a portion of the optoelectronic assembly 200 may be positioned over a support 220. Turning to FIG. 3B, the portion of the optoelectronic assembly 200 may be positioned on the support 220. The support 220 may be configured to reinforce the portion of the optoelectronic assembly 200 during various aspects of manufacturing. In some configurations, the support 220 may be formed of an optical, transparent or translucent material. In such configurations, the support 220 may facilitate optical alignment or testing of the portion of the optoelectronic assembly 200 during manufacture.

Figure 3C:
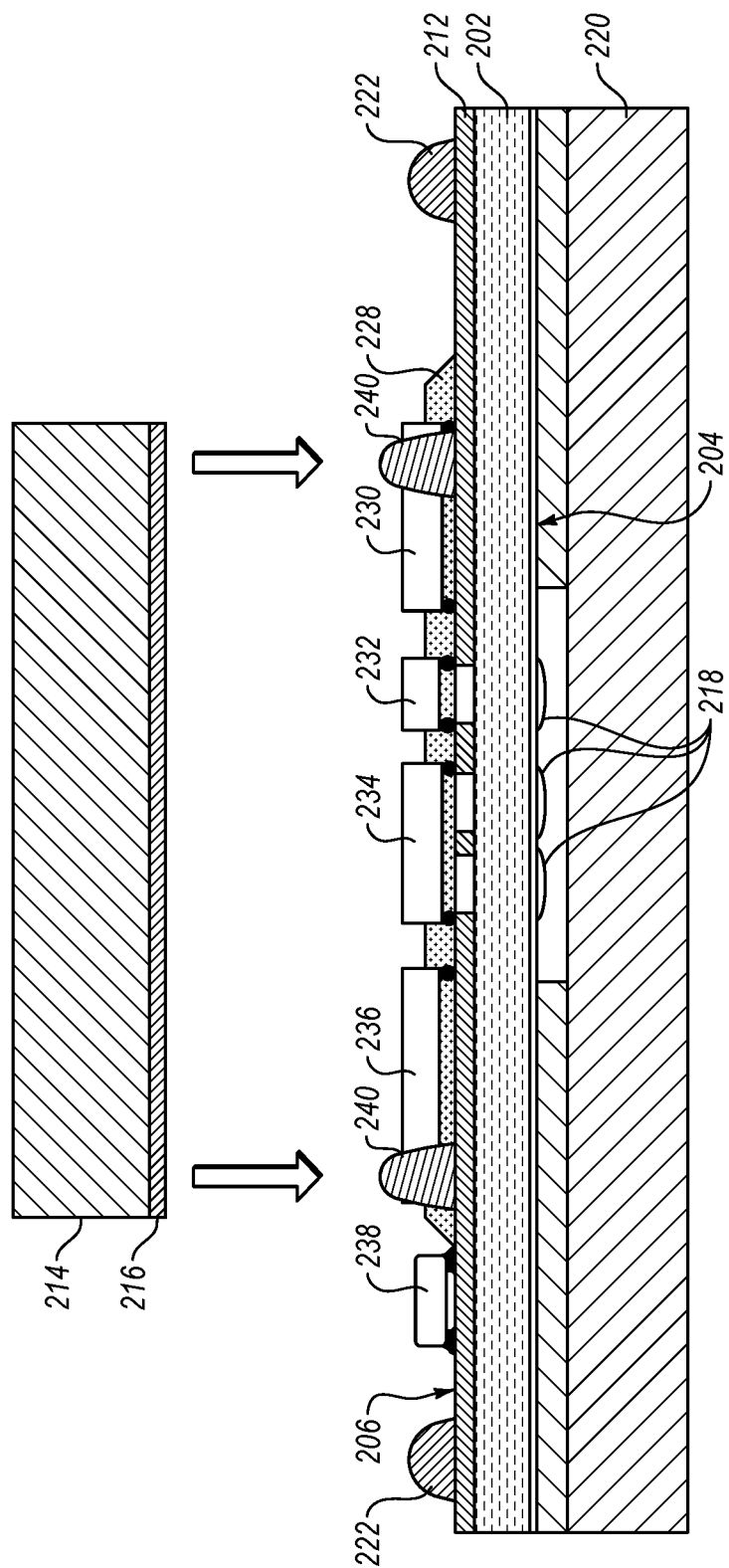
Figure 3D:
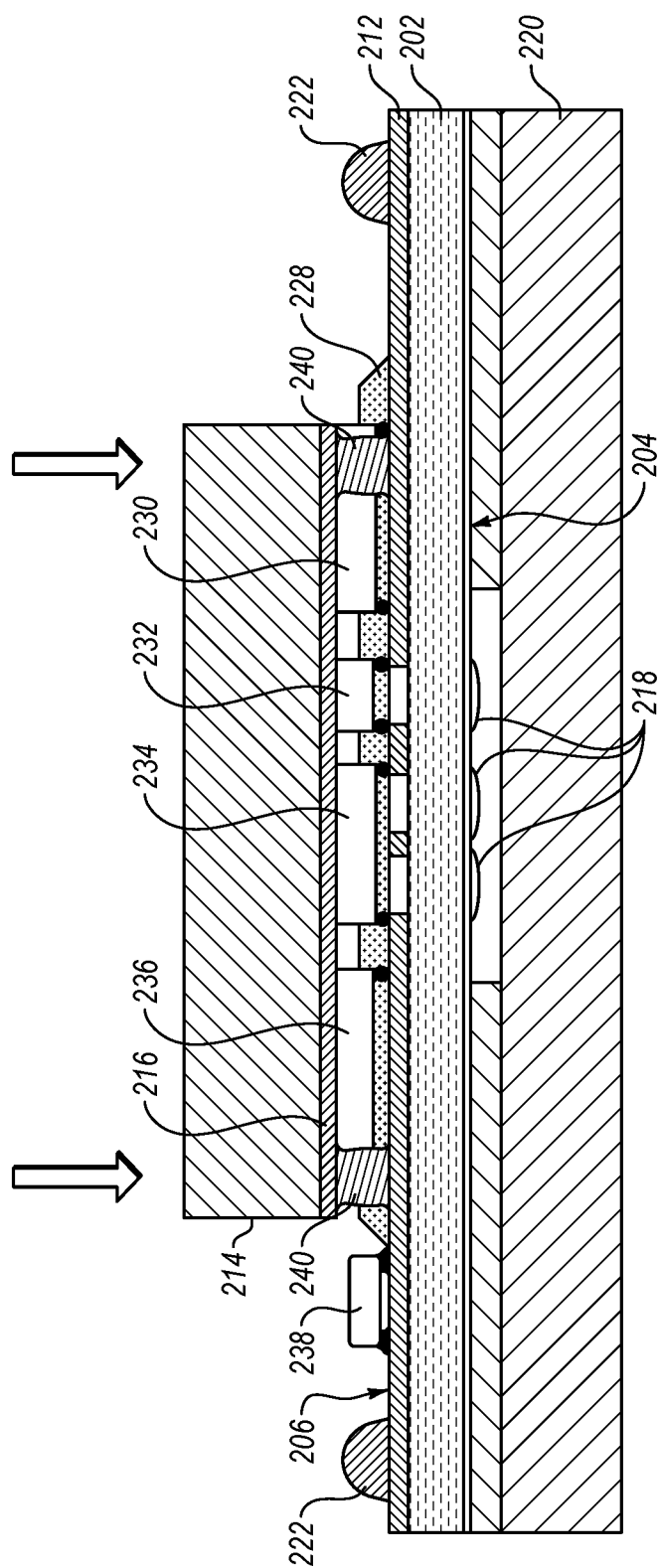

As illustrated in FIG. 3C, the second component 214 may be positioned over the transparent component 202 and the laser array 232, the receiver array 234, the driver 236, and/or the electrical component 230. In some configurations, the adhesive 242 may be disposed on the second component 214. Turning to FIG. 3D, the second component 214 may be coupled to the transparent component 202 and the laser array 232, the receiver array 234, the driver 236, and/or the electrical component 230.

The second component 214 and the transparent component 202 may be coupled to one another by the adhesive 240. After the adhesive 240 is disposed on the second component 214, the transparent component 202 may be positioned to interface with the adhesive 240 so the transparent component 202 is retained with respect to the second component 214 by the adhesive 240.

The second component 214 may mechanically and thermally coupled to the laser array 232, the receiver array 234, the driver 236, and/or the electrical component 230. For example, as illustrated in FIG. 3C, the thermal interface material 216 may be attached to the second component 214 which may then be positioned to interface with the laser array 232, the receiver array 234, the driver 236, and/or the electrical component 230. In some configurations, the thermal interface material 216 retains the second component 214 to the laser array 232, the receiver array 234, the driver 236, and/or the electrical component 230. In other configurations, the thermal interface material 216 may be positioned against the laser array 232, the receiver array 234, the driver 236, and/or the electrical component 230 but may not retain the respective components to one another. The thermal interface material 216 may thermally couple the second component 214 to the laser array 232, the receiver array 234, the driver 236, and/or the electrical component 230 such that heat may be transmitted from the laser array 232, the receiver array 234, the driver 236, and/or the electrical component 230 to the second component 214, or vice versa.

As illustrated, some components, such as the passive component 238, may be coupled to the transparent component 202 but not the second component 214. Such components may not create heat during operation, or may not create as much heat as other components such as the laser array 232, the receiver array 234, the driver 236, and/or the electrical component 230. Thus, such components may not require or benefit from heat dissipation through the second component 214.

As indicated by the arrows in FIG. 3D, a force may be applied to the second component 214 to dispose it against the transparent component 202, the laser array 232, the receiver array 234, the driver 236, and/or the electrical component 230 as the components are coupled to one another. This may facilitate ensuring a suitable interface is formed between the coupled components.

Figure 3E:
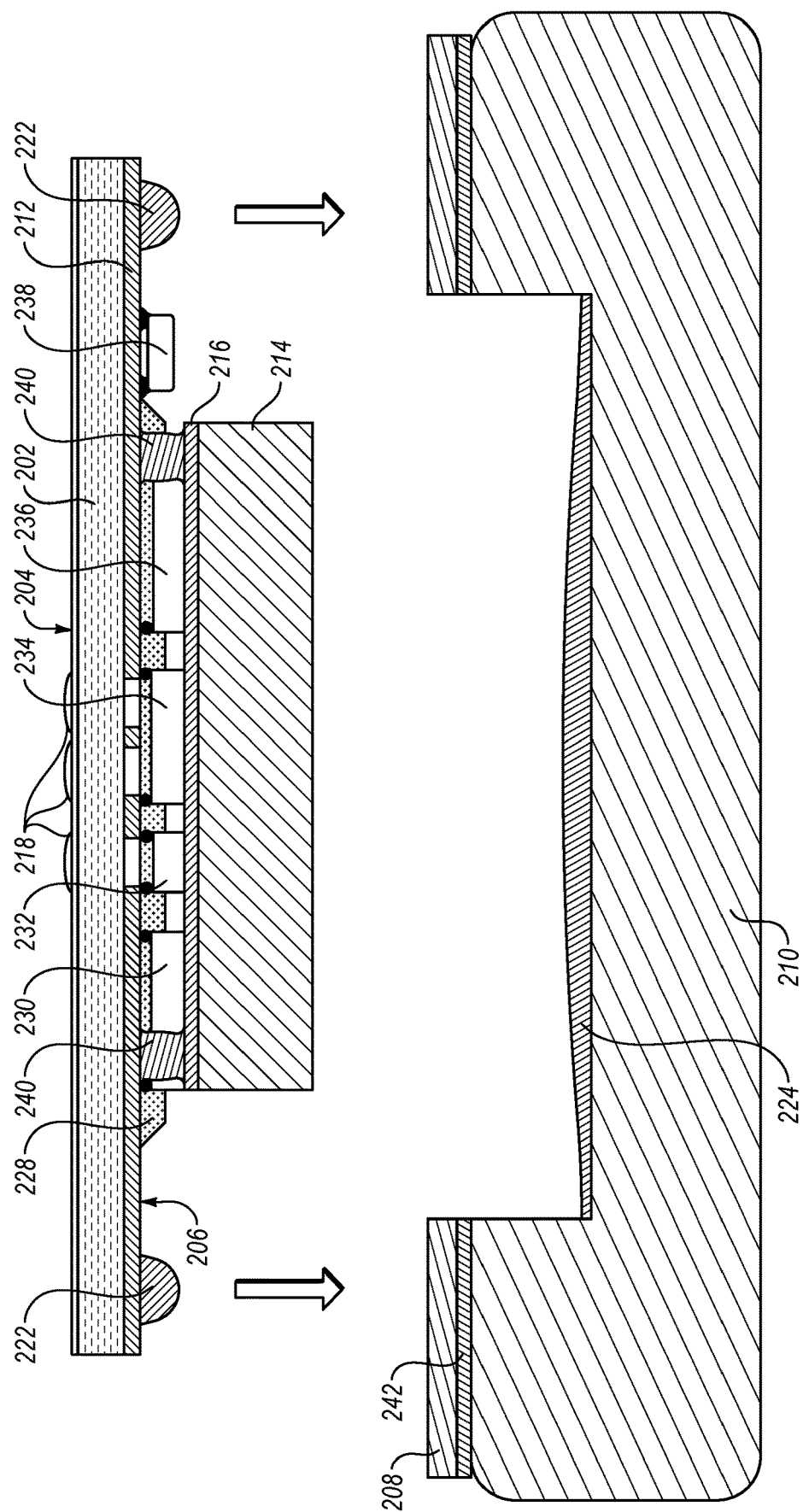

Turning to FIG. 3E, the first component 210 may be coupled to the electronic substrate 208, for example, with an adhesive 242. The second solder 224 may be positioned in the receptacle 244 of the first component 210. The portion of the optoelectronic assembly 200 illustrated in FIG. 3D including the second component 214 coupled to the transparent component 202 may be positioned over the receptacle 244 of the first component 210.

Figure 3F:
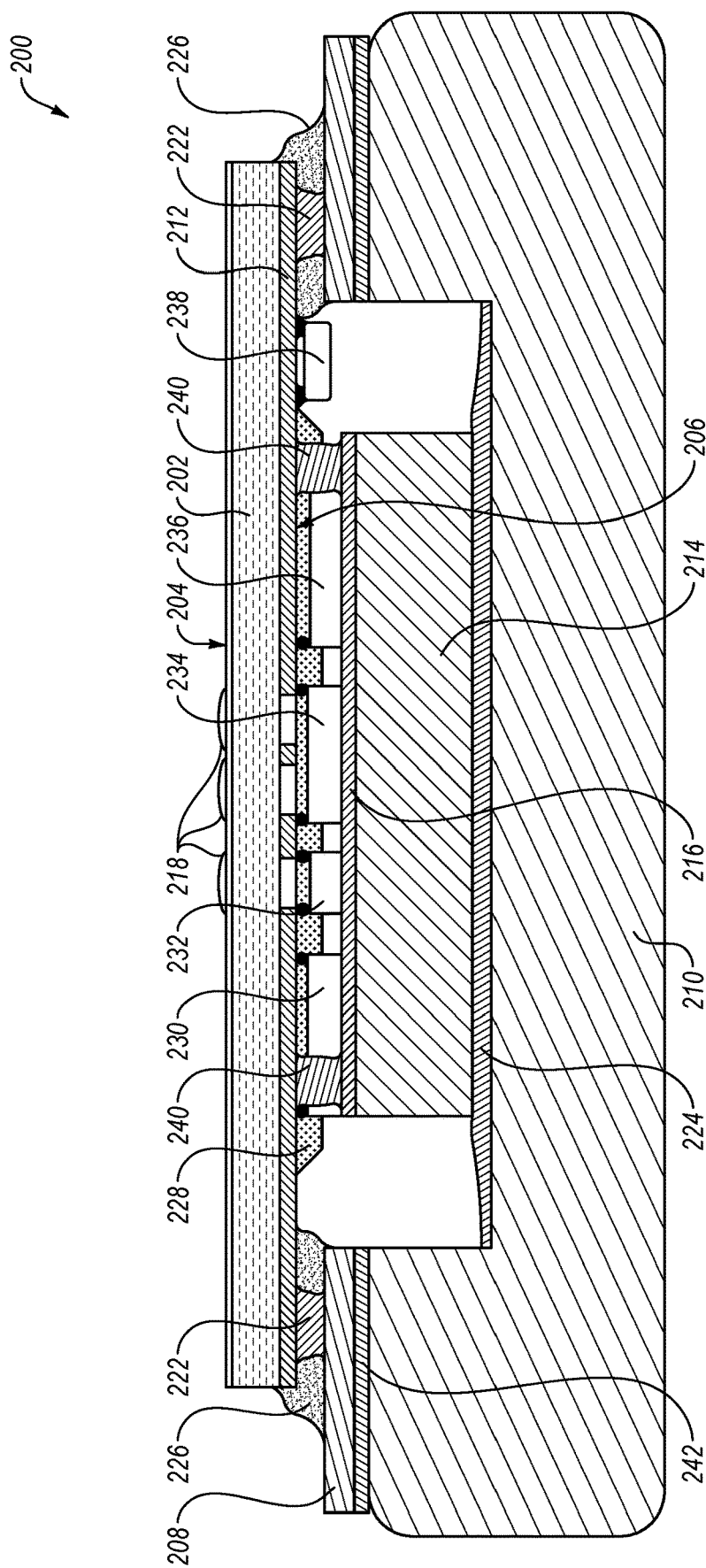

As illustrated in FIG. 3F, the second component 214 coupled to the transparent component 202 may be positioned at least partially within the receptacle 244 such that the second component 214 interfaces with the first component 210, for example, at the second solder 224, and such that the transparent component 202 interfaces the electronic substrate 208, for example, at the first solder 222. The first solder 222 and/or the second solder 224 may be heated to at least partially melt or soften the first solder 222 and/or the second solder 224. Heating the first solder 222 may mechanically and/or electrically couple the transparent component 202 to the electronic substrate 208. Heating the second solder 224 may mechanically and thermally couple the first component 210 and the second component 214.

In some configurations, the first solder 222 and the second solder 224 may include different melting points such that the first solder 222 melts at a lower temperature than the second solder 224, or vice versa. In such configurations, when at least a portion of the optoelectronic assembly 200 is heated, one of the first solder 222 or the second solder 224 melts and/or forms a bond before the other solder. Such configurations may facilitate portions of the optoelectronic assembly 200 to be positioned and/or aligned during assembly.

For example, the second solder 224 may include a lower melting point than the first solder 222. The optoelectronic assembly 200 may be heated to melt the first solder 222 position the second component 214 against the first component 210 in the receptacle 244 to form a suitable interface. The optoelectronic assembly 200 may be heated further to melt the first solder 222 to form a bond between the transparent component 202 and the electronic substrate 208.

In some aspects, a boundary may be formed to facilitate in preventing the first solder 222 and/or the second solder 224 from being applied to or travelling to undesired portions of the optoelectronic assembly 200. In such configurations, the boundary may be configured to confine the first solder 222 and/or the second solder 224 in desired areas of the optoelectronic assembly 200. For example, in some configurations, the boundary may include a solder mask or a solder resist that facilitates in preventing the first solder 222 and/or the second solder 224 from being applied to undesired portions of the optoelectronic assembly 200. The solder mask may include a layer of polymer applied to areas proximate the first solder 222 and/or the second solder 224 to prevent the solder from being applied to undesired areas. In other configurations, any suitable boundary may be implemented to prevent the first solder 222 and/or the second solder 224 from being applied to or travelling to undesired portions of the optoelectronic assembly 200.

After the first solder 222 couples the transparent component 202 and the electronic substrate 208, the optoelectronic assembly 200 may be cooled to solidify the solder bond, and the underfill material 226 may be positioned around the first solder 222. Additionally or alternatively, the underfill material 226 may be positioned to seal the transparent component 202 to the electronic substrate 208.

Figure 4:
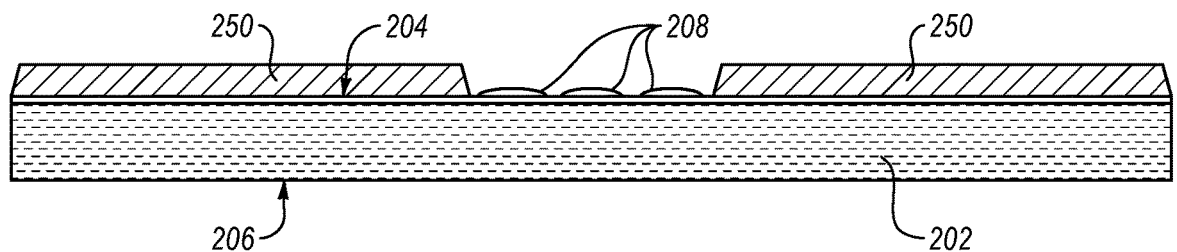
FIG. 4 is example of a transparent component that may be implemented in the optoelectronic assembly of FIG. 2.

FIG. 4 is an example of the transparent component 202 with a lens guard 250. As illustrated, the lens guard 205 may be positioned on the first surface 204 over a portion of the transparent component 202. The lens guard 250 may be sized and shaped to shield the lenses 218. Such configurations may facilitate in preventing the lenses 218 from being damaged in some circumstances. For example, the lens guard 250 facilitate in protecting the lenses 218 when the transparent component 202 is positioned on a support, such as the support 220 of FIGS. 3A-3D. In such circumstances, the support 220 may not include and/or require structures to protect the lenses 218.

Figure 5:
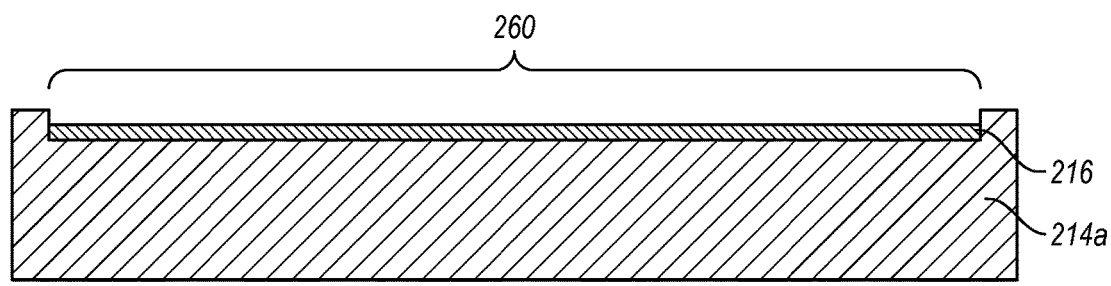
FIG. 5 is an example of a component that may be implemented in the optoelectronic assembly of FIG. 2.

FIG. 5 is another example of a second component 214a. The second component 214a may include any suitable aspects described with respect to the second component 214. As illustrated, the second component 214a may include a recess 260. The recess 260 may be configured to receive and/or retain the thermal interface material 216. In some aspects, the recess 260 may facilitate manufacture of the optoelectronic assembly 200. For example, the recess 260 may retain the thermal interface material 216 during formation of the thermal interface material 216. In other aspects the recess 260 may facilitate positioning of the thermal interface material 216. The recess 260 may extend substantially the length of the second component 214a. In some configurations, the recess 260 terminates proximate the ends of the second component 214a. In some configurations, the recess 260 may include a dimension, such as depth, of 100 micrometers (μm). In some configurations, the recess 260 may include a depth of between 0 and 200 μm, between 50 and 150 μm, between 80 and 120 μm, or any other suitable value or combination thereof.

The terms used in the description and claims are not limited to the bibliographical meanings, but, are merely used to enable a clear and consistent understanding of the disclosure. It is to be understood that the singular forms of words such as "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

Aspects of the present disclosure may be embodied in other forms without departing from its spirit or essential characteristics. The described aspects are to be considered in all respects illustrative and not restrictive. The claimed subject matter is indicated by the appended claims rather than by the foregoing description. All changes which come within the meaning and range of equivalency of the claims are to be embraced within their scope.

What is claimed is:

1. An optoelectronic assembly, comprising:
   a transparent component that extends between a first surface and an oppositely positioned second surface;
   a laser array coupled to the second surface of the transparent component, the laser array oriented to transmit optical signals through the transparent component;
   a receiver array coupled to the second surface of the transparent component, the receiver array oriented to receive optical signals through the transparent component;
   an electronic substrate mechanically coupled to the transparent component;
   a first component coupled to the electronic substrate opposite the transparent component, the first component defining a receptacle; and
   a second component positioned between the first component and the transparent component in the receptacle defined by the first component, a first continuous surface of the second component coupled to both the laser array and the receiver array by a thermal interface material, the thermal interface material being softer than the first component and the second component, and a second surface of the second component coupled to the first component by solder, the second surface of the second component positioned opposite the first surface of the second component.

2. The optoelectronic assembly of claim 1, wherein the electronic substrate is mechanically coupled to the transparent component with second solder, the second solder having a melting point different than a melting point of the solder.

3. The optoelectronic assembly of claim 1, wherein the transparent component is coupled to the second component by adhesive positioned therebetween.

4. The optoelectronic assembly of claim 1, further comprising a redistribution layer positioned on the second surface of the transparent component, the redistribution layer electrically coupled to at least the electronic substrate and the laser array or the receiver array.

5. The optoelectronic assembly of claim 4, further comprising an electronic component coupled to the second surface of the transparent component, the electronic component electrically coupled to the laser array or the receiver array by the redistribution layer.

6. The optoelectronic assembly of claim 4, further comprising a passive component coupled to the second surface of the transparent component, the passive component electrically coupled to the redistribution layer.

7. The optoelectronic assembly of claim 4, further comprising one or more lenses positioned on the first surface of the transparent component, the laser array oriented to transmit optical signals through at least one of the lenses, and the receiver array oriented to receive optical signals through at least another one of the lenses.

8. An optoelectronic assembly, comprising:
   an electronic substrate;
   a transparent component coupled on a first side of the electronic substrate;
   a first component coupled to a second side of the electronic substrate opposite the first side;
   wherein the electronic substrate, the transparent component, and the first component define a hermetically sealed enclosure;
   a laser array and a receiver array mechanically coupled to the transparent component inside of the enclosure and oriented to transmit and receive optical signals through the transparent component, respectively, the laser array and the receiver array electrically coupled to the electronic substrate; and
   a second component positioned between the first component and the transparent component in the hermetically sealed enclosure with a thermal interface material forming a first interface between the second component and the transparent component and a first continuous surface of the second component coupled to both the laser array and the receiver array.

9. The optoelectronic assembly of claim 8, further comprising a first solder forming a second interface between the second component and the first component.

10. The optoelectronic assembly of claim 9, further comprising a redistribution layer positioned on a surface of the transparent component, the redistribution layer electrically coupled to at least the electronic substrate and the laser array or the receiver array.

11. The optoelectronic assembly of claim 10, wherein:
    the electronic substrate is mechanically coupled to the transparent component with second solder;
    the electronic substrate is electrically coupled to the redistribution layer with the second solder;
    the second solder includes a melting point different than a melting point of the first solder; and
    a boundary confines the second solder.

12. The optoelectronic assembly of claim 10, further comprising an electronic component coupled to the transparent component inside of the enclosure, the electronic component electrically coupled to the laser array or the receiver array by the redistribution layer.

13. The optoelectronic assembly of claim 10, further comprising a passive component coupled to the transparent component inside of the enclosure, the passive component electrically coupled to the redistribution layer.

14. The optoelectronic assembly of claim 8, wherein the transparent component is coupled to the second component by adhesive positioned therebetween.

15. The optoelectronic assembly of claim 8, further comprising one or more lenses positioned on a surface of the transparent component, the laser array oriented to transmit optical signals through at least one of the lenses, and the receiver array oriented to receive optical signals through at least another one of the lenses.

16. The optoelectronic assembly of claim 8, the second component defining a recess with the thermal interface material positioned therein.

17. An optoelectronic assembly, comprising:
a heat sink including a second component positioned inside of a receptacle of a first component;
a transparent component;
an optoelectronic array coupled to the transparent component and oriented to transmit or receive optical signals through the transparent component;
an electronic component coupled to the transparent component;
an electronic substrate positioned between the transparent component and the first component, the electronic substrate coupled to the transparent component; and
a thermal interface material positioned between the optoelectronic array, the electronic component, and the second component, the thermal interface material coupling a first continuous surface of the second component to both the optoelectronic array and the electronic component.

18. The optoelectronic assembly of claim 17, further comprising a solder positioned at an interface of the first and second components.

19. The optoelectronic assembly of claim 17, further comprising epoxy positioned at an interface of the electronic substrate and the first component.

20. The optoelectronic assembly of claim 17, further comprising a solder positioned at an interface of the electronic substrate and the transparent component.

\* \* \* \* \*